United States Patent
Yang et al.

(10) Patent No.: US 11,736,335 B2
(45) Date of Patent: Aug. 22, 2023

(54) DUALBAND PREDISTORTION SYSTEM FOR WIRELESS COMMUNICATION

(71) Applicant: SUMITOMO ELECTRIC DEVICE INNOVATIONS, INC., Yokohama (JP)

(72) Inventors: Ruikang Yang, Bridgewater, NJ (US); Michael Russo, Morris Plains, NJ (US); Simon Hamparian, Emerson, NJ (US)

(73) Assignee: SUMITOMO ELECTRIC DEVICE INNOVATIONS, INC., Yokohama (JP)

( * ) Notice: Subject to any disclaimer, the term of this patent is extended or adjusted under 35 U.S.C. 154(b) by 0 days.

(21) Appl. No.: 17/542,671

(22) Filed: Dec. 6, 2021

(65) Prior Publication Data
US 2023/0179466 A1  Jun. 8, 2023

(51) Int. Cl.
*H04L 27/36* (2006.01)
*H04L 27/38* (2006.01)
*H04L 27/26* (2006.01)

(52) U.S. Cl.
CPC ........ *H04L 27/367* (2013.01); *H04L 27/2695* (2013.01); *H04L 27/3836* (2013.01)

(58) Field of Classification Search
CPC .......... H04L 27/367; H04L 27/2695; H04L 27/3836
See application file for complete search history.

(56) References Cited

U.S. PATENT DOCUMENTS

| | | | |
|---|---|---|---|
| 7,183,847 B2 | 2/2007 | Suzuki et al. | |
| 2005/0162225 A1* | 7/2005 | Suzuki | H03F 1/3247 330/149 |

(Continued)

FOREIGN PATENT DOCUMENTS

| | | | | |
|---|---|---|---|---|
| CN | 107895074 A | * | 4/2018 | ............. G06F 17/11 |
| FR | 2924541 A1 | * | 6/2009 | ............. A61K 31/52 |
| WO | WO-2020144482 A1 | * | 7/2020 | ......... H04B 10/2575 |

OTHER PUBLICATIONS

Machine Translation of CN-107895074-A. (Year: 2022).*

(Continued)

*Primary Examiner* — Jean B Corrielus
(74) *Attorney, Agent, or Firm* — Faegre Drinker Biddle & Reath LLP

(57) ABSTRACT

Various embodiments of the present disclosure relate to transmitter systems, methods, and instructions for signal predistortion. The transmitter system includes a signal decomposition module configured to extract a low-frequency signal ($S_{lo}$) and a high-frequency signal ($S_{hi}$) from an input signal ($S_{in}$); a distortion compensation processing module configured to generate a pre-distorted low-frequency signal ($U_{lo}$) and a pre-distorted high-frequency signal ($U_{hi}$) based on the received low-frequency and high-frequency signals using signal generation coefficients; a signal combining module configured to combine the pre-distorted low-frequency signal ($U_{lo}$) and the pre-distorted high-frequency signal ($U_{hi}$); and a signal characteristic estimation processing module configured to update the signal generation coefficients used by the distortion compensation processing module based on comparing the low-frequency signal ($S_{lo}$) and the high-frequency signal ($S_{hi}$) with a detected feedback low-frequency signal ($Y_{lo}$) and a detected feedback high-frequency signal ($Y_{hi}$).

20 Claims, 5 Drawing Sheets

(56) References Cited

U.S. PATENT DOCUMENTS

| | | | |
|---|---|---|---|
| 2014/0139286 A1* | 5/2014 | Laporte | H03F 3/24 |
| | | | 330/149 |
| 2014/0254716 A1* | 9/2014 | Zhou | H04B 1/0475 |
| | | | 375/296 |
| 2016/0285485 A1 | 9/2016 | Fehri et al. | |
| 2021/0152133 A1 | 5/2021 | Mochida | |

OTHER PUBLICATIONS

Machine Translation of FR-2924541-A1. (Year: 2022).*
Machine Translation of JP-2011119845-A (Year: 2022).*
Ding, Lei et al., "A Robust Digital Baseband Predistorter Constructed Using Memory Polynomials," IEEE Transactions on Communications, vol. 52, No. 1, Jan. 2004, pp. 159-165.
Abdelaziz, Mahmoud et al, "Decorrelation-Based Concurrent Digital Predistortion With a Single Feedback Path," IEEE Transactions on Microwave Theory and Techniques, IEEE, USA, vol. 66, No. 1, Jan. 1, 2018, p. 280-p. 293.
Kwan, Andrew K. et al, "Selective Intermodulation Compensation in a Multi-Stage Digital Predistorter for Nonlinear Multi-Band Power Amplifiers," IEEE Journal on Emerging and Selected Topics in Circuits and Systems, IEEE, Piscataway, NJ, USA, vol. 7, No. 4, Dec. 1, 2017, p. 534-p. 546.

\* cited by examiner

US 11,736,335 B2

DUALBAND PREDISTORTION SYSTEM FOR WIRELESS COMMUNICATION

FIELD OF THE DISCLOSURE

The present disclosure relates generally to distortion compensation for an amplifier and, more particularly, to a system and method for compensating for amplifier distortion.

BACKGROUND OF THE DISCLOSURE

Amplifiers can have non-linear characteristics. Distortion compensation techniques are used for compensating for distortions in signals caused by the non-linear characteristics. An instantaneous change in distortion may occur in a GaN amplifier, for example. Such distortions can degrade the bit-error rate (BER) performance of the amplifier.

FIG. 1 illustrates a prior art system 100 for performing distortion compensation which implements a predistorter and a parameter identification module therefor. The system 100 includes a signal source 102 which provides a digital input signal ($S_{in}$) that is initially provided to a digital-analog converter (DAC) 106 to be converted into an analog radiofrequency (RF) input signal. An in-phase/quadrature (IQ) signal modulator 108 performs IQ modulation on the RF input signal based on a predetermined frequency of a local oscillator 110 to provide a signal to be amplified by a power amplifier (PA) 112, the resulting signal of which is an output signal ($S_{out}$) to be transmitted through an antenna 114.

In the prior art system 100, the change in distortion in the PA 112 is dealt with by updating distortion compensation coefficients implemented in a distortion compensation device in response to the change in the distortion. Specifically, the output signal ($S_{out}$) is provided via a feedback loop to an IQ signal demodulator 116, using the same frequency of the local oscillator 110 as the IQ modulator 108, and the demodulated signal is provided to the analog-digital converter (ADC) 118 to be provided to a parameter identification module 120, which is part of the distortion compensation device. The parameter identification module 120 receives the input signal ($S_{in}$) and compares it to the received signal from the ADC 118, then updates the distortion compensation coefficients to be used by a predistorter module 104, also part of the distortion compensation device, such that the output signal to be provided to the DAC 106 would be predistorted to accommodate for the distortion caused by the PA 112.

The predistorter module 104, known in the art, is implemented in the digital baseband domain and generates a complementary nonlinearity to that of the PA 112. The predistorted baseband signal is upconverted to the RF signal via the IQ modulator 108 and then feed to the PA 112. To synthesize the predistorter function, a portion of the signal from the PA 112 is extracted and down-converted via the IQ demodulator 116 to be used to estimate the parameters of a predistorter model.

By updating the distortion compensation coefficients, distortion compensation characteristics of the distortion compensation device are updated in response to the change in the distortion. In order to follow an instantaneous change in distortion, it is necessary to perform frequent updating of the distortion compensation characteristics. Since a processing load for updating the distortion compensation characteristics is great, however, it is not always easy to frequently update the distortion compensation characteristics in preparation for a change in distortion. Therefore, an improved technique for dealing with a change in distortion is desired.

SUMMARY OF THE DISCLOSURE

Various embodiments of the present disclosure relate to transmitter systems for signal predistortion, including the embodiment of the system described in this paragraph. The transmitter system includes a signal decomposition module configured to extract a low-frequency signal ($S_{lo}$) and a high-frequency signal ($S_{hi}$) from an input signal ($S_{in}$). The system also includes a distortion compensation processing module configured to generate a pre-distorted low-frequency signal ($U_{lo}$) and a pre-distorted high-frequency signal ($U_{hi}$) based on the received low-frequency and high-frequency signals using signal generation coefficients. The system includes a signal combining module configured to combine the pre-distorted low-frequency signal ($U_{lo}$) and the pre-distorted high-frequency signal ($U_{hi}$). The system includes a signal characteristic estimation processing module configured to update the signal generation coefficients used by the distortion compensation processing module based on comparing the low-frequency signal ($S_{lo}$) and the high-frequency signal ($S_{hi}$) with a detected feedback low-frequency signal ($Y_{lo}$) and a detected feedback high-frequency signal ($Y_{hi}$).

In some examples, the detected feedback low-frequency signal ($Y_{lo}$) is obtained by demodulating an output signal ($S_{out}$) of the system at a first frequency (Fl) and the detected feedback high-frequency signal ($Y_{hi}$) is obtained by demodulating the output signal ($S_{out}$) at a second frequency (Fh) different from the first frequency value. In some examples, a combined signal ($U_{out}$) is obtained by combining the pre-distorted low-frequency signal ($U_{lo}$) and the pre-distorted high-frequency signal ($U_{hi}$), the output signal ($S_{out}$) is generated by modulating the combined signal ($U_{out}$) at a carrier center frequency value (Fc), and the carrier center frequency (Fc) is an arithmetic mean of the first frequency (Fl) and the second frequency (Fh). In some examples, the output signal ($S_{out}$) is obtained via a feedback loop. In some examples, a difference between the first frequency (Fl) and the second frequency (Fh) is at least 50 MHz, at least 100 MHz, at least 150 MHz, or at least 300 MHz.

Also disclosed herein are methods for performing signal predistortion, including the embodiment of the method described in this paragraph. The method includes extracting, by a signal decomposition module, a low-frequency signal ($S_{lo}$) and a high-frequency signal ($S_{hi}$) from an input signal ($S_{in}$); generating, by a distortion compensation processing module, a pre-distorted low-frequency signal ($U_{lo}$) and a pre-distorted high-frequency signal ($U_{hi}$) based on the received low-frequency and high-frequency signals using signal generation coefficients; combining, by a signal combining module, the pre-distorted low-frequency signal ($U_{lo}$) and the pre-distorted high-frequency signal ($U_{hi}$); and updating, by a signal characteristic estimation processing module, the signal generation coefficients used by the distortion compensation processing module based on comparing the low-frequency signal ($S_{lo}$) and the high-frequency signal ($S_{hi}$) with a detected feedback low-frequency signal ($Y_{lo}$) and a detected feedback high-frequency signal ($Y_{hi}$).

In some examples, the method further includes generating the detected feedback low-frequency signal ($Y_{lo}$) by demodulating an output signal ($S_{out}$) of the system at a first frequency (Fl); and generating the detected feedback high-frequency signal ($Y_{hi}$) by demodulating the output signal ($S_{out}$) at a second frequency (Fh) different from the first frequency value. In some examples, the method further includes generating a combined signal ($U_{out}$) by combining the pre-distorted low-frequency signal ($U_{lo}$) and the pre-distorted high-frequency signal ($U_{hi}$); and generating the output signal ($S_{out}$) by modulating the combined signal ($U_{out}$) at a carrier center frequency value (Fc) that is an arithmetic mean of the first frequency (Fl) and the second frequency (Fh). In some examples, the output signal ($S_{out}$) is obtained via a feedback loop. In some examples, a difference between the first frequency (Fl) and the second frequency (Fh) is at least 50 MHz, at least 100 MHz, at least 150 MHz, or at least 300 MHz.

Also disclosed herein are embodiments of at least one non-transitory computer-readable medium, including the embodiment of the at least one non-transitory embodiment described in this paragraph, storing instructions therein which, when run on a processor, causes the processor to extract a low-frequency signal ($S_{lo}$) and a high-frequency signal ($S_{hi}$) from an input signal ($S_{in}$); generate a pre-distorted low-frequency signal ($U_{lo}$) and a pre-distorted high-frequency signal ($U_{hi}$) based on the received low-frequency and high-frequency signals using signal generation coefficients; combine the pre-distorted low-frequency signal ($U_{lo}$) and the pre-distorted high-frequency signal ($U_{hi}$); and update the signal generation coefficients used by the distortion compensation processing module based on comparing the low-frequency signal ($S_{lo}$) and the high-frequency signal ($S_{hi}$) with a detected feedback low-frequency signal ($Y_{lo}$) and a detected feedback high-frequency signal ($Y_{hi}$).

In some examples, the instructions further cause the processor to generate the detected feedback low-frequency signal ($Y_{lo}$) by demodulating an output signal ($S_{out}$) of the system at a first frequency (Fl); and generate the detected feedback high-frequency signal ($Y_{hi}$) by demodulating the output signal ($S_{out}$) at a second frequency (Fh) different from the first frequency value. In some examples, the instructions further cause the processor to generate a combined signal ($U_{out}$) by combining the pre-distorted low-frequency signal ($U_{lo}$) and the pre-distorted high-frequency signal ($U_{hi}$); and generate the output signal ($S_{out}$) by modulating the combined signal ($U_{out}$) at a carrier center frequency value (Fc) that is an arithmetic mean of the first frequency (Fl) and the second frequency (Fh). In some examples, the output signal ($S_{out}$) is obtained via a feedback loop. In some examples, a difference between the first frequency (Fl) and the second frequency (Fh) is at least 50 MHz, at least 100 MHz, at least 150 MHz, or at least 300 MHz.

While multiple embodiments are disclosed, still other embodiments of the present disclosure will become apparent to those skilled in the art from the following detailed description, which shows and describes illustrative embodiments of the disclosure. Accordingly, the drawings and detailed description are to be regarded as illustrative in nature and not restrictive.

BRIEF DESCRIPTION OF THE DRAWINGS

The embodiments will be more readily understood in view of the following description when accompanied by the below figures and wherein like reference numerals represent like elements. These depicted embodiments are to be understood as illustrative of the disclosure and not as limiting in any way.

Figure 1:
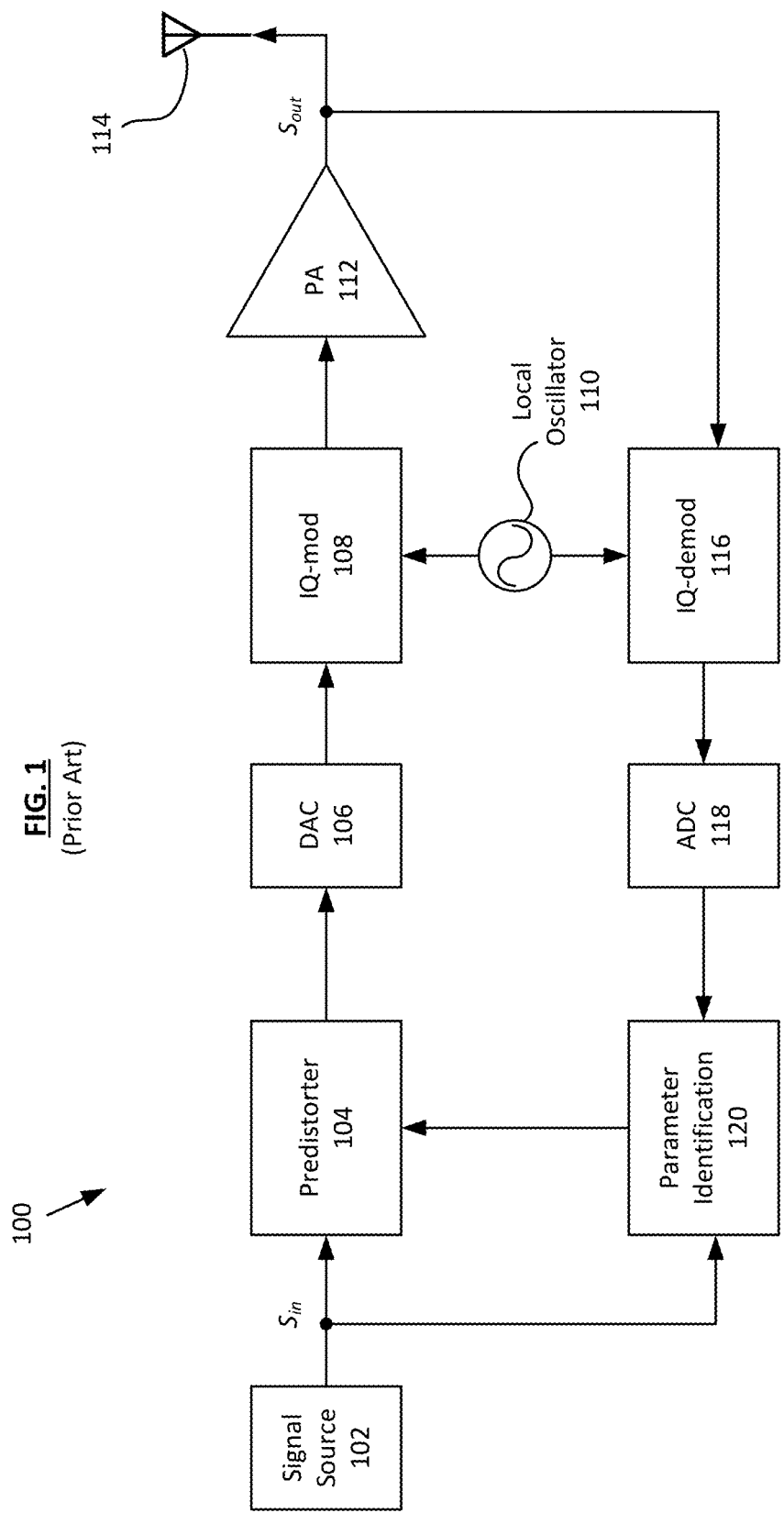
FIG. 1 shows a prior art signal transmission system including a known distortion compensation device.

While the present disclosure is amenable to various modifications and alternative forms, specific embodiments have been shown by way of example in the drawings and are described in detail below. The intention, however, is not to limit the present disclosure to the particular embodiments described. On the contrary, the present disclosure is intended to cover all modifications, equivalents, and alternatives falling within the scope of the present disclosure as defined by the appended claims.

DETAILED DESCRIPTION OF THE DISCLOSURE

In the following detailed description, reference is made to the accompanying drawings which form a part hereof, and in which are shown by way of illustration specific embodiments in which the present disclosure is practiced. These embodiments are described in sufficient detail to enable those skilled in the art to practice the present disclosure, and it is to be understood that other embodiments can be utilized and that structural changes can be made without departing from the scope of the present disclosure. Therefore, the following detailed description is not to be taken in a limiting sense, and the scope of the present disclosure is defined by the appended claims and their equivalents.

Reference throughout this specification to "one embodiment," "an embodiment," or similar language means that a particular feature, structure, or characteristic described in connection with the embodiment is included in at least one embodiment of the present disclosure. Appearances of the phrases "in one embodiment," "in an embodiment," and similar language throughout this specification may, but do not necessarily, all refer to the same embodiment. Similarly, the use of the term "implementation" means an implementation having a particular feature, structure, or characteristic described in connection with one or more embodiments of the present disclosure, however, absent an express correlation to indicate otherwise, an implementation may be associated with one or more embodiments. Furthermore, the described features, structures, or characteristics of the subject matter described herein may be combined in any suitable manner in one or more embodiments.

With respect to terminology, the terms "about" and "approximately" may be used, interchangeably, to refer to a measurement that includes the stated measurement and that also includes any measurements that are reasonably close to the stated measurement. Measurements that are reasonably close to the stated measurement deviate from the stated measurement by a reasonably small amount as understood and readily ascertained by individuals having ordinary skill in the relevant arts. Such deviations may be attributable to measurement error, differences in measurement and/or manufacturing equipment calibration, human error in reading and/or setting measurements, minor adjustments made to optimize performance and/or structural parameters in view of differences in measurements associated with other components, particular implementation scenarios, imprecise adjustment and/or manipulation of objects by a person or machine, and/or the like, for example. In the event it is determined that individuals having ordinary skill in the relevant arts would not readily ascertain values for such reasonably small differences, the terms "about" and "approximately" can be understood to mean plus or minus 10% of the stated value.

Figure 2:
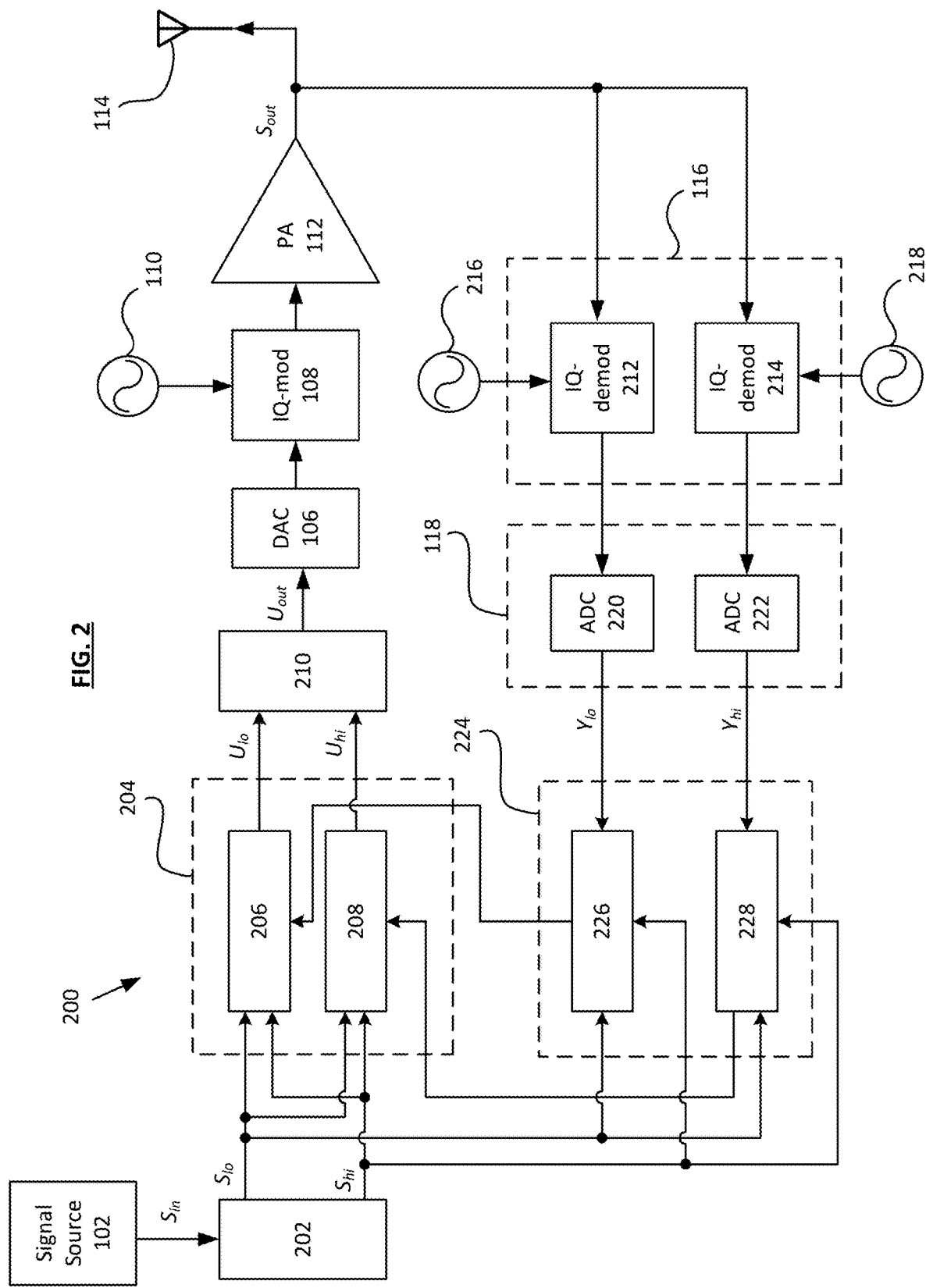
FIG. 2 shows a dual-band signal transmission system with distortion compensation functionality, according to the embodiments disclosed herein.

FIG. 2 illustrates an example of a signal transmission device or system 200 as disclosed herein for performing digital predistortion (DPD) for distortion compensation of the PA 112. It is to be understood that in some examples, each of the functional blocks in the figures may be implemented as an individual component, or a plurality of functional blocks may be implemented together in a component, as suitable for designing, manufacturing, or operating the device or system. The system 200 includes a signal decomposition module 202 which extracts a low-frequency signal ($S_{lo}$) and a high-frequency signal ($S_{hi}$) from an input signal ($S_{in}$) provided from the signal source 102. The signal extraction is based on extracting only a portion of the input signal, where the portion of the signal to be extracted is determined based on two different and separate carrier frequencies. Any suitable method of signal extraction may be implemented, including but not limited to linear filtering. For example, the carrier frequency for each of the low-frequency and high-frequency extractions may be determined based on the spectral density of the input signal, as further discussed herein. Examples of frequencies for the low-frequency signal ($S_{lo}$) and a high-frequency signal ($S_{hi}$) may be 1840 MHz and 2140 MHz, respectively.

The system 200 further includes a distortion compensation processing module 204 which generates a pre-distorted low-frequency signal ($U_{lo}$) and a pre-distorted high-frequency signal ($U_{hi}$) based on the received low-frequency and high-frequency signals using suitable signal generation coefficients generated by and provided from a signal characteristic estimation processing module 224. Examples of frequencies for the pre-distorted low-frequency signal ($U_{lo}$) and pre-distorted high-frequency signal ($U_{hi}$) may be 1840 MHz and 2140 MHz, respectively. The manner in which the pre-distorted low-frequency signal ($U_{lo}$) and pre-distorted high-frequency signal ($U_{hi}$) are generated is described herein and as follows.

In some examples, the pre-distorted signals $U_{lo}$ and $U_{hi}$ are generated separately and independently of each other. In the example shown, the distortion compensation processing module 204 includes a low-frequency distortion compensation processing module 206 and a high-frequency distortion compensation processing module 208. The low-frequency processing module 206 receives the decomposed input signals $S_{lo}$ and $S_{hi}$ as well as the low-frequency signal generation coefficients from the signal characteristic estimation processing module 224, as further disclosed herein, and based on these, the processing module 206 generates the pre-distorted signal $U_{lo}$. The frequency processing module 208 receives the decomposed input signals $S_{lo}$ and $S_{hi}$ as well as the high-frequency signal generation coefficients from the signal characteristic estimation processing module 224, and based on these, the processing module 208 generates the pre-distorted signal $U_{hi}$. When the pre-distorted signals are generated, they are combined using a signal combining module 210 which generates a combined pre-distorted output signal ($U_{out}$) by adding together the predistorted low-frequency and high-frequency signals ($U_{lo}$, $U_{hi}$). The pre-distorted output signal $U_{out}$ is converted using the DAC 106, upconverted using the IQ-modulator 108, and amplified using the PA 112, as known in the art and described above with respect to FIG. 1, to generate the output signal $S_{out}$ to be transmitted via the antenna 114.

In the feedback loop comprising the IQ demodulator 116, ADC 118, and the signal characteristic estimation processing module 224, the output signal $S_{out}$ is demodulated based on two different frequencies which are determined based on the frequencies implemented by the signal decomposition module 202. For example, a first IQ demodulator 212 uses a first frequency determined by an oscillator 216, and a second IQ demodulator 214 uses a second frequency determined by another oscillator 218. The frequency of the oscillator 216 is lower than the frequency of the oscillator 218, with examples of frequencies for the first and second oscillator frequencies being 1840 MHz and 2140 MHz, respectively. Thereafter the demodulated signal from the IQ demodulator 212 is converted using a first ADC 220 to generate a detected low-frequency feedback signal ($Y_{lo}$), and the demodulated signal from the IQ demodulator 214 is converted using a second ADC 222 to generate a detected high-frequency feedback signal ($Y_{hi}$). Examples of frequencies for the low-frequency feedback signal ($Y_{lo}$) and high-frequency feedback signal ($Y_{hi}$) would be 1840 MHz and 2140 MHz, respectively. Although the IQ demodulators 212 and 214 are illustrated as separate functional blocks, in some examples, the demodulation for both of the detected feedback signal $Y_{lo}$ and $Y_{hi}$ may instead be performed by a single IQ demodulator 116 to which the oscillators 216 and 218 are switchably coupled (in which case IQ demodulator 116 would only include one of IQ demodulators 212 or 214). Also, although the ADCs 220 and 222 are illustrated as separate functional blocks, in some examples, the analog-to-digital conversion of the low-frequency and high-frequency signals may instead be performed by a single ADC 118 to which the IQ demodulator 116 or IQ demodulators 212 and 214 are switchably coupled (in which case ADC 118 would only include one of ADCs 220 or 222).

The system 200 includes a signal characteristic estimation processing module 224 which generates the low-frequency and high-frequency signal generation coefficients used by the distortion compensation processing module 204 based on comparing the low-frequency decomposed input signal ($S_{lo}$) and the high-frequency decomposed input signal ($S_{hi}$) with the detected feedback low-frequency signal ($Y_{lo}$) and the detected feedback high-frequency signal ($Y_{hi}$), respectively. In some examples, the signal characteristic estimation processing module 224 may be a processing unit operating with a memory unit with a lookup table which stores therein the values for the low-frequency and high-frequency signal generation coefficients which may be updated or optimized during subsequent iterations of the cycle of outputting signal transmissions and analyzing the difference (or error margin) between the outputted signal and the initial signal during each iteration, thereby improving the accuracy of the signal characteristic estimation processing module 224. In some examples, the processing unit of the signal characteristic estimation processing module 224 may calculate the coefficients to be implemented for the subsequent cycle using any suitable instructions or algorithms that are configured to determine the updated coefficients in order to reduce the error margin between the input signal and the output signal. In some examples, the calculation may involve solving a normal equation based on a least-squares method, or any other suitable method as known in the art.

In some examples, the low-frequency and high-frequency signal generation coefficients are generated separately and independently of each other. In the example shown, the signal characteristic estimation processing module 224 includes a low-frequency signal characteristic estimation processing module 226 and a high-frequency signal characteristic estimation processing module 228. The low-frequency processing module 226 receives the decomposed input signals $S_{lo}$ and $S_{hi}$ as well as the low-frequency detected feedback signal $Y_{lo}$ and performs the comparison between the low-frequency detected feedback signal $Y_{lo}$ and the low-frequency decomposed input signal $S_{lo}$, with the assistance from the high-frequency decomposed input signal $S_{hi}$, to generate the low-frequency signal generation coefficients. This is shown in Equations 4 and 5, as further discussed herein, used to calculate the predistorted signals, where the low-frequency predistorted signal $y_L(n)$ and the high-frequency predistorted signal $y_U(n)$ are both calculated using the low-frequency and high-frequency decomposed input signals, i.e. $x_L(n)$ and $x_U(n)$. The high-frequency processing module 228 receives the decomposed input signals $S_{lo}$ and $S_{hi}$ as well as the high-frequency detected feedback signal $Y_{hi}$ and performs the comparison between the high-frequency detected feedback signal $Y_{hi}$ and the high-frequency decomposed input signal $S_{hi}$, with the assistance from the low-frequency decomposed input signal $S_{lo}$, to generate the high-frequency signal generation coefficients. This is shown in Equations 4 and 5, as further discussed herein, used to calculate the predistorted signals, where the low-frequency predistorted signal $y_L(n)$ and the high-frequency predistorted signal $y_U(n)$ are both calculated using the low-frequency and high-frequency decomposed input signals, i.e. $x_L(n)$ and $x_U(n)$. The low-frequency and high-frequency signal generation coefficients are provided to the distortion compensation processing module 204 which uses them to generate the pre-distorted signals $U_{lo}$ and $U_{hi}$.

Figure 3:
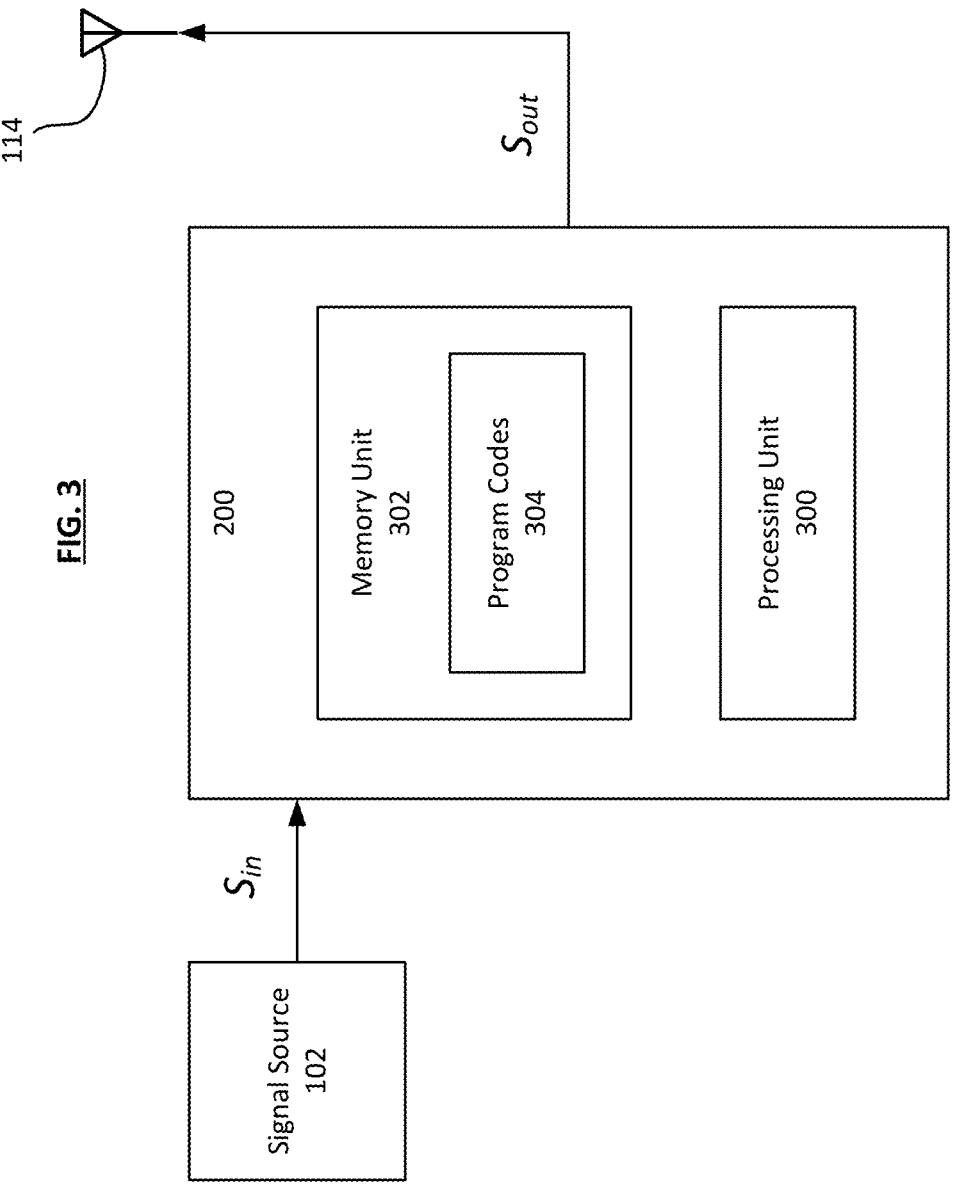
FIG. 3 shows a signal transmission device with distortion compensation functionality, according to the embodiments disclosed herein.

FIG. 3 shows an example of the signal transmission system 200 according to embodiments disclosed herein. Each of the individual blocks or modules as explained with respect to the signal transmission system 200 may be implemented as at least one processing unit or processor 300 coupled with a memory unit 302 which stores thereon program codes 304 to be executed by the processing unit or processor 300. In some examples, each block or module may be implemented using a single processor or a set of processors operating together. In some examples, multiple blocks or modules may be implemented using a single processor or a set of processors operating together. The processing unit or processor may be any suitable device for processing data inputs, including but not limited to a central processing unit (CPU) of a computing device, a virtual CPU of a virtual machine, a multicore CPU, a system on a chip (SoC), etc., which has been specifically programmed or instructed as described herein to carry out the specific operations of the present disclosure. The processing unit or processor may be a programmable processing or micro-processing device of a solid-state, integrated circuit type that includes one or more processing units and memory. Processors can include one or more Arithmetic Logic Units (ALUs), CPUs, memory devices, and/or different circuitry or functional components, etc., as would occur to those skilled in the art to perform the desired implementations. The processing unit or processor may be communicatively coupled with an external device such as a user device (including but not limited to desktop or laptop computer, smartphone, personal digital assistant, tablet computer, etc.) via any suitable digital communications device or system including but not limited to the Internet, a cloud computing network, or a personal area network such as WLAN/WPAN connectivity, via wireless communications. In some examples, there may be a plurality of processors which are functionally coupled together and therefore operate together.

The memory unit 302 may be any suitable non-transitory computer-readable storage medium which can be local, remote, or distributed. The memory may include, among other components, random access memory (RAM), such as dynamic RAM (DRAM) and static RAM (SRAM), for example. The memory may also be or include a non-volatile storage such as a magnetic floppy or hard disk, a magnetic-optical disk, an optical disk, a read-only memory (ROM), such as a CD-ROM, EPROM, or EEPROM, a magnetic or optical card, or another form of storage for large amounts of data. Some of this data is often written, by a direct memory access process, into memory during execution of software on the computer system. The memory may also store the software or computer program codes 304 which, when executed by the processor 300, perform the methods, processes, and/or algorithms as disclosed herein.

Figure 4:
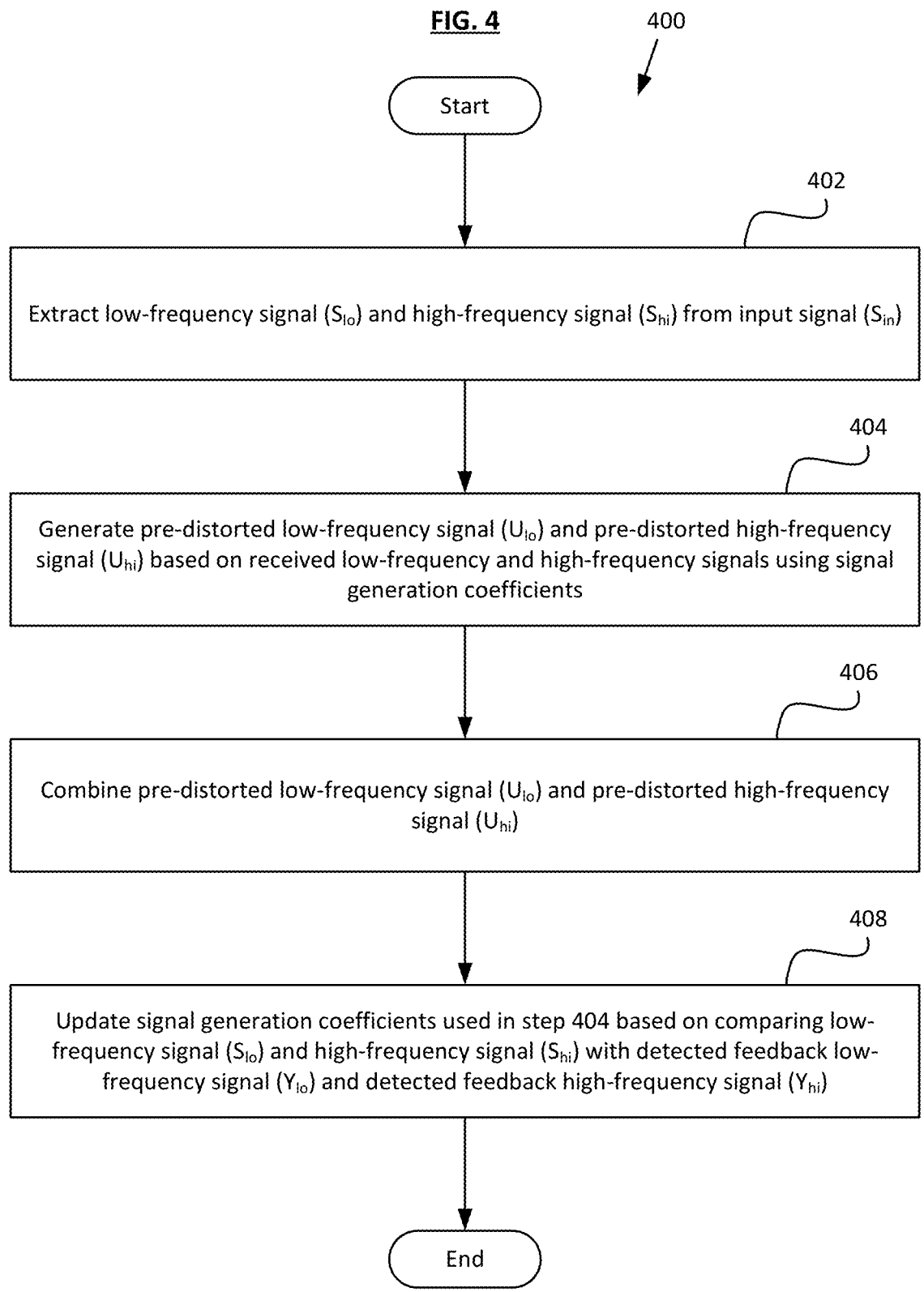
FIG. 4 shows a process of performing dual-band signal transmission with distortion compensation, according to the embodiments disclosed herein.
Figure 5:
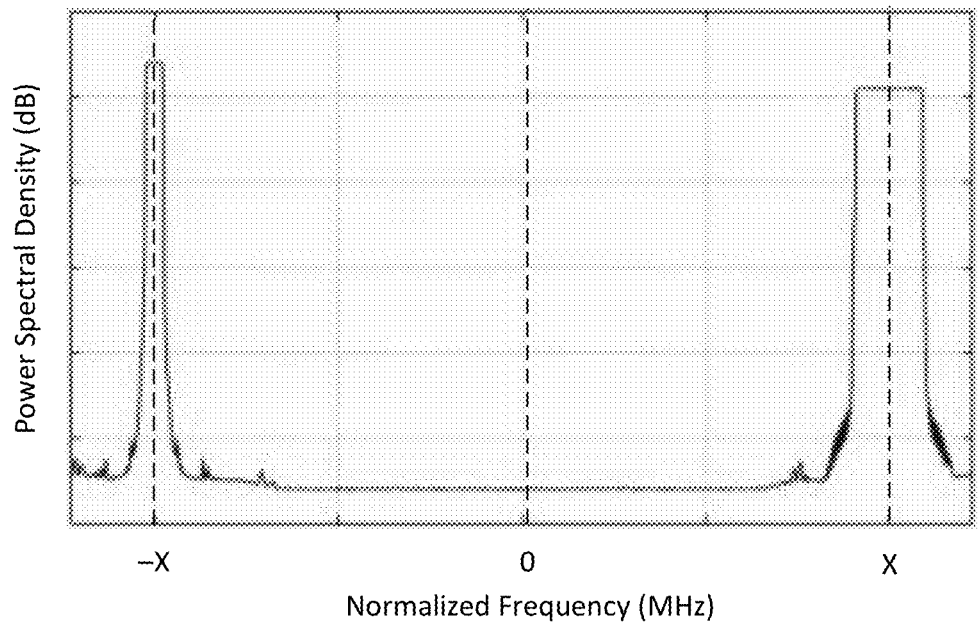
FIG. 5 shows a spectral density plot of a normalized input signal that is a composite signal with two component carriers, according to the embodiments disclosed herein.
Figure 6:
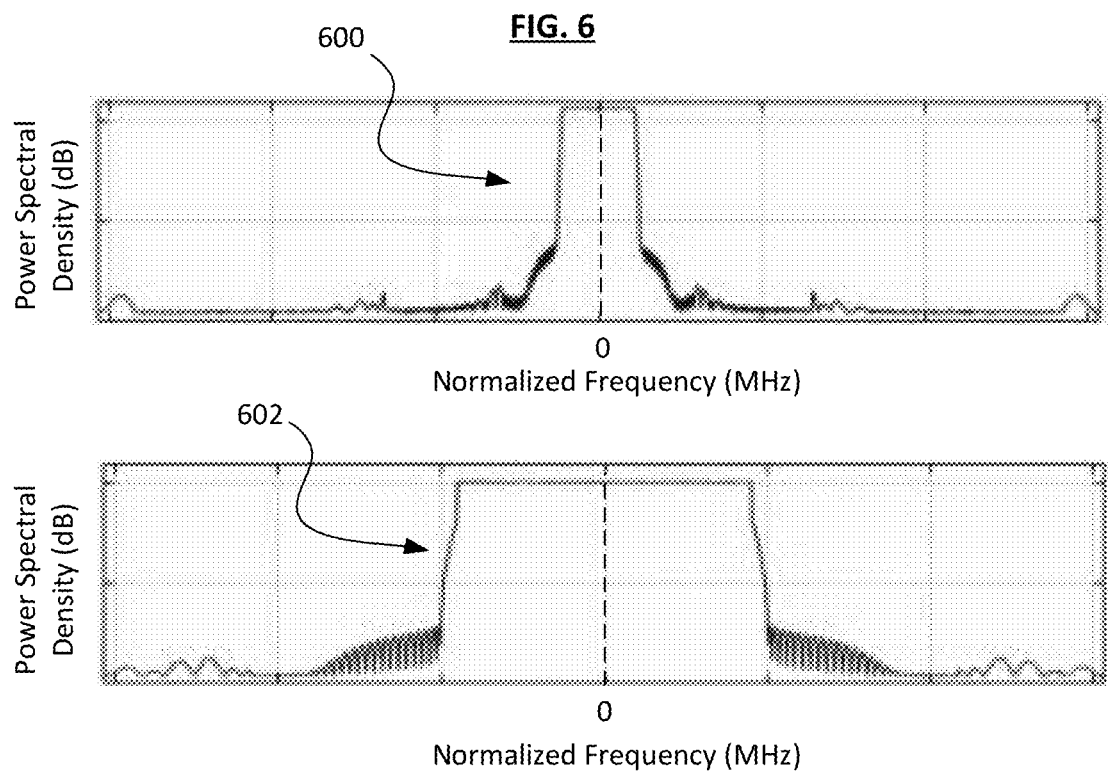
FIG. 6 shows two separate spectral density plots of normalized low-frequency input signal and the normalized high-frequency input signal based on the input signal of FIG. 5, according to the embodiments disclosed herein.

FIG. 4 shows an example of a process 400 performed by the processor 300 according to embodiments disclosed herein. The process 400 may be performed by the processor 300 when the instructions or program codes 304 stored on the non-transitory computer-readable medium or the memory unit 302 are run on the processor 300. The process 400 includes step 402 in which the processor extracts a low-frequency signal ($S_{lo}$) and a high-frequency signal ($S_{hi}$) from an input signal ($S_{in}$) provided by any suitable input signal source. For example, the processor 300 may perform these operations by incorporating and/or utilizing a signal decomposition module 202 as described above. The input signal $S_{in}$ is a composite signal with two component carriers (CC) as shown in FIG. 5, where the power spectral density (PSD) of the input signal $S_{in}$ is normalized so as to be shifted so that the center of the bandwidth is located at the baseband (0 Hz). The bandwidth of the input signal $S_{in}$ is greater than the bandwidth of each of the two component carriers. The extraction process may involve determining the suitable carrier frequency for each of the signals $S_{lo}$ and $S_{hi}$ and then isolating the input signal at the two determined carrier frequencies to generate the signals $S_{lo}$ and $S_{hi}$. Each PSD of the extracted signals $S_{lo}$ and $S_{hi}$ is normalized, i.e. centered at the baseband (0 Hz), and each PSD of the extracted signals $S_{lo}$ and $S_{hi}$ may have a much smaller bandwidth than the original input signal $S_{in}$, as shown in FIG. 6.

In step 404, the processor generates a pre-distorted low-frequency signal ($U_{lo}$) and a pre-distorted high-frequency signal ($U_{lm}$) based on the received low-frequency and high-frequency signals $S_{lo}$ and $S_{hi}$ using signal generation coefficients. For example, the processor 300 may perform these operations by incorporating and/or utilizing a distortion compensation processing module 204 (which in turn may include a low-frequency distortion compensation processing module 206 and a high-frequency distortion compensation processing module 208) as described above. In this case, the signal generation coefficients may have been previously determined during a prior feedback loop as further explained herein, or the coefficients may be predetermined, such as a set of "default" coefficients that are provided for the initial cycle and thereafter updated according to the measured distortion caused by the power amplifier, as further explained herein.

In step 406, the processor combines the pre-distorted low-frequency signal ($U_{lo}$) and the pre-distorted high-frequency signal ($U_{hi}$) to generate a combined pre-distorted output signal ($U_{out}$). For example, the processor 300 may perform this operation by incorporating and/or utilizing a signal combining module 210 as described above. The combined output signal $U_{out}$ is fed by the processor 300 to the DAC to be converted into an analog signal, to the IQ modulator to be upconverted using a carrier frequency "$F_c$", and then to the power amplifier, as previously explained, to be transmitted as an output signal $S_{out}$ by any suitable transmitter. The output signal $S_{out}$ includes distortions caused by the non-linear characteristics of the power amplifier using any suitable transmission format as known in the art, including but not limited to code-division multiple access (CDMA) and orthogonal frequency-division multiplexing (OFDM), which may be vulnerable to PA nonlinearities due to the high peak-to-average power ratio, corresponding to large fluctuations in signal envelopes.

In the feedback loop implemented to compensate for the distortions, the processor, in step 408, updates the signal generation coefficients used in step 404 based on comparing the low-frequency signal ($S_{lo}$) and the high-frequency signal ($S_{hi}$) with a detected feedback low-frequency signal ($Y_{lo}$) and a detected feedback high-frequency signal ($Y_{hi}$). For example, the processor 300 may perform these operations by incorporating and/or utilizing a signal characteristic estimation processing module 224 (which in turn may include a low-frequency signal characteristic estimation processing module 226 and a high-frequency signal characteristic estimation processing module 228) as described above. The detected feedback signals $Y_{lo}$ and $Y_{hi}$ may be provided by down-converting the output signal $S_{out}$ using IQ demodulators using two different component carrier center frequencies (for example, a component carrier center frequency "$F_l$" for the lower-frequency signal $Y_{lo}$ and another component carrier center frequency "$F_h$" for the high-frequency signal $Y_{hi}$) after which the down-converted signal is converted to digital signal via the ADC. The carrier frequencies $F_l$ and $F_h$ may be related to the carrier frequency $F_c$ via the following formula: $F_c = (F_l + F_h)/2$.

In FIG. 5, the difference between the central carrier frequency $F_c$ and either of the frequency $F_l$ or $F_h$ is expressed as "X" such that when the input signal $S_{in}$ is centered at the baseband of 0 Hz, the low-frequency component carrier is located at —X Hz, and the high-frequency component carrier is located at X Hz; thus, the distance between the frequencies of the two component carriers is 2*X (also referred to as a wideband spacing between the two component carriers), and therefore the bandwidth of the input signal $S_{in}$ is greater than 2*X. In some examples, if the value of X=100 MHz, the bandwidth of $S_{in}$ may be approximately 250 MHz. In comparison, FIG. 6 shows the extracted low-frequency signal ($S_{lo}$) 600 and the extracted high-frequency signal ($S_{hi}$) 602 when extracted from the original signal in FIG. 5. The bandwidth of each of the extracted signals 600 and 602 is less than the bandwidth of the original signal. In the above example where X=100 MHz, the bandwidth of each of the extracted signals 600 and 602 may be approximately 5 MHz, 10 MHz, 20 MHz, 40 MHz, 60 MHz, or any other suitable value therebetween, for example. In some examples, the carrier frequencies $F_l$ and $F_h$ may differ by at least about 50 MHz, by at least about 100 MHz, by at least about 150 MHz, by at least 200 MHz, by at least 300 MHz, by at least 350 MHz, or by any other suitable value or range therebetween.

Discussed below is an exemplary implementation of the subject disclosure according to some embodiments as disclosed herein, in which Equation 2 shows that the input signal has low-frequency and high-frequency components; Equation 3 shows that the predistorted output signal also has low-frequency and high-frequency components; and Equations 4-5 show an exemplary method on how to calculate the predistorted low-frequency and high-frequency output signals using the coefficients. Based on a generalized polynomial model indicated in Lei et al, "A Robust Digital Baseband Predistorter Constructed Using Memory Polynomials," IEEE *Transactions on Communications*, 52(1), p.159-165, in some examples, the predistorted signal may be generated using the following form:

$$y(n) = \sum_{l=0}^{L-1} x(n-l) \sum_{m=-M_1}^{M_2} b_{lm} \sum_{k=0}^{K} a_{mk} |x(n-l-m)|^{2k} \quad \text{(Equation 1)}$$

where L is the memory depth, K is the highest nonlinearity order, $M_1$ is backward cross term length, $M_2$ is forward cross term length, and $a_{mk}$ and $b_{lm}$ are the signal generation coefficients which are updated according to compensate for the distortion caused by the PA. Thus, for example, in the system depicted in FIG. 2, y(n) and x(n) may correspond to $U_{out}$ and $S_{in}$, respectively. The coefficients may be collected or provided in a matrix or a table stored in the memory, which is utilized by the processor for calculating the predistorted signal using the above equation.

Assuming that the input signal has two component carriers $x_L$ (lower component carrier) and $x_U$ (upper component carrier), the input signal x(n) can be expressed as follows (with implementation of same taking place within module 202, for example):

$$x(n) = x_L e^{-j\omega_0 t} + x_u e^{j\omega_0 t} \quad \text{(Equation 2)}$$

The predistorted signal y(n) from Equation (1) can then be expressed as follows (with implementation of same taking place within module 210, for example):

$$y(n) = y_L e^{-j\omega_0 t} + y_u e^{j\omega_0 t} \quad \text{(Equation 3)}$$

where $y_L$ and $y_U$ are the predistorted signals based on the following formulas (with the implementation of Equation 4 taking place in modules 206 and 226, and the implementation of Equation 5 taking place in modules 208 and 228, for example):

$$y_L(n) = \quad \text{(Equation 4)}$$

$$\left[ \sum_{l=0}^{N_{lb_{xb}}-1} x_L(n-l) \sum_{m=-N_{mc_{xb}}}^{N_{mb_{xb}}} b_{lm} \sum_{k=1}^{N_{kb_{xb}}} a_{mk} \sum_{i=0}^{k} c_{ki} |x_L(n-l-m)|^{2(k-i)} |x_U(n-l-m)|^{2i} \right] +$$

$$\left[\sum_{l=0}^{N_{lb_{xb}}-1} x_U(n-l) \sum_{m=-N_{mc_{xb}}}^{N_{mb_{xb}}} b_{lm} \right.$$

$$\left. \sum_{k=1}^{N_{kb_{xb}}} a_{mk} \sum_{i=0}^{k} c_{ki}|x_L(n-l-m)|^{2(k-1-i)}|x_U(n-l-m)|^{2i}x_L(n-l-m)x_U^*(n-l-m)\right] +$$

$$\left[\sum_{l=0}^{N_{la_{xbim}}-1} x_U^*(n-l) \sum_{k=0}^{N_{ka_{xbim}}-1} b_{lk}\sum_{i=0}^{k} c_{ki}|x_U(n-l)|^{2i}|x_L(n-l)|^{2(k-i)}\right]$$

$$y_U(n) = \qquad\qquad\qquad\qquad\qquad\qquad\qquad\text{(Equation 5)}$$

$$\left[\sum_{l=0}^{N_{lb_{xb}}-1} x_U(n-l) \sum_{m=-N_{mc_{xb}}}^{N_{mb_{xb}}} b_{lm} \sum_{k=1}^{N_{kb_{xb}}} a_{mk}\sum_{i=0}^{k} c_{ki}|x_U(n-l-m)|^{2(k-i)}|x_L(n-l-m)|^{2i}\right] +$$

$$\left[\sum_{l=0}^{N_{lb_{xb}}-1} x_L(n-1) \sum_{m=-N_{mc_{xb}}}^{N_{mb_{xb}}} b_{lm}\right.$$

$$\left.\sum_{k=1}^{N_{kb_{xb}}} a_{mk}\sum_{i=0}^{k} c_{ki}|x_U(n-l-m)|^{2(k-1-i)}|x_L(n-l-m)|^{2i}x_U(n-l-m)x_L^*(n-l-m)\right] + \Bigg[$$

$$\sum_{l=0}^{N_{la_{xbim}}-1} x_L^*(n-l) \sum_{k=0}^{N_{ka_{xbim}}-1} b_{lk}\sum_{i=0}^{k} a_{mk}|x_L(n-l)|^{2i}|x_U(n-l)|^{2(k-i)}\Bigg]$$

where:
$N_{lb_{xb}}$ is the cross-band memory depth;
$N_{mb_{xb}}$ is the cross-band backward cross term length;
$N_{mc_{xb}}$ is the cross-band backward cross term length;
$N_{kb_{xb}}$ is the cross-band nonlinearity order;
$N_{la_{xbim}}$ is the cross-band image memory depth;
$N_{ka_{xbim}}$ is the cross-band image nonlinearity order;
$a_{mk}$, $b_{lk}$, $b_{lm}$, and $c_{ki}$ are the signal generation coefficients which may be stored in the memory as a matrix or a table;
$x^*_U$ is the conjugative signal of $x_U$; and
$x^*_L$ is the conjugative signal of $x_L$.

Advantages of implementing the signal transmission device or system as disclosed herein include the reduction in bandwidth necessary to process the input and output signals in determining the coefficients to be implemented for distortion compensation. By decomposing a signal into two separate signals, each with a component carrier at a frequency different from the other, the signal processing can be performed using a narrower bandwidth which encompasses only one of the component carriers instead of both the component carriers, as known in the art. As such, the reduction in processing bandwidth improves the efficiency of signal processing by reducing the processing load for updating the distortion compensation characteristics. Reduction in processing load allows the processor to more frequently perform updates of the distortion compensation characteristics (that is, the signal generation coefficients) in preparation for a change in distortion.

The present subject matter may be embodied in other specific forms without departing from the scope of the present disclosure. The described embodiments are to be considered in all respects only as illustrative and not restrictive. Those skilled in the art will recognize that other implementations consistent with the disclosed embodiments are possible. The above detailed description and the examples described therein have been presented for the purposes of illustration and description only and not for limitation. For example, the operations described can be done in any suitable manner. The methods can be performed in any suitable order while still providing the described operation and results. It is therefore contemplated that the present embodiments cover any and all modifications, variations, or equivalents that fall within the scope of the basic underlying principles disclosed above and claimed herein. Furthermore, while the above description describes hardware in the form of a processor executing code, hardware in the form of a state machine, or dedicated logic capable of producing the same effect, other structures are also contemplated.

What is claimed is:

1. A transmitter system comprising:
a signal decomposition module configured to extract a low-frequency signal ($S_{lo}$) and a high-frequency signal ($S_{hi}$) from an input signal ($S_{in}$);
a first in-phase/quadrature (IQ) demodulator configured to generate a detected low-frequency feedback signal ($Y_{lo}$) based on an output signal ($S_{out}$) of the transmitter system using a first frequency (Fl) determined by a first oscillator;
a second IQ demodulator configured to generate a detected high-frequency feedback signal ($Y_{hi}$) based on the output signal ($S_{out}$) of the transmitter system using a second frequency (Fh) determined by a second oscillator;
a signal characteristic estimation processing module configured to update signal generation coefficients based on comparing the low-frequency signal ($S_{lo}$) and the high-frequency signal ($S_{hi}$) with the detected low-frequency feedback signal ($Y_{lo}$) and the detected high-frequency feedback signal ($Y_{hi}$);
a distortion compensation processing module configured to generate a pre-distorted low-frequency signal ($U_{lo}$)

and a pre-distorted high-frequency signal ($U_{hi}$) based on the low-frequency and high-frequency signals using the updated signal generation coefficients;

a signal combining module configured to combine the pre-distorted low-frequency signal ($U_{lo}$) and the pre-distorted high-frequency signal ($U_{hi}$) to generate a combined pre-distorted output signal ($U_{out}$); and an IQ modulator configured to generate a the output signal ($S_{out}$) based on the combined pre-distorted output signal ($U_{out}$) using a carrier center frequency value (Fc) determined by a third oscillator, wherein the carrier center frequency (Fc) is an arithmetic mean of the first frequency (Fl) and the second frequency (Fh).

2. The transmitter system of claim 1, wherein the output signal ($S_{out}$) is obtained via a feedback loop.

3. The transmitter system of claim 1, wherein a difference between the first frequency (Fl) and the second frequency (Fh) is at least 50 MHz.

4. The transmitter system of claim 1, wherein a difference between the first frequency (Fl) and the second frequency (Fh) is at least 100 MHz.

5. The transmitter system of claim 1, wherein a difference between the first frequency (Fl) and the second frequency (Fh) is at least 150 MHz.

6. The transmitter system of claim 1, wherein a difference between the first frequency (Fl) and the second frequency (Fh) is at least 300 MHz.

7. The transmitter system of claim 1, wherein the distortion compensation processing module is configured to generate the pre-distorted low-frequency signal based on a following equation:

$$y_L(n) =$$

$$\left[\sum_{l=0}^{N_{lb_{xb}}-1} x_L(n-l) \sum_{m=-N_{mc_{xb}}}^{N_{mb_{xb}}} b_{lm} \sum_{k=1}^{N_{kb_{xb}}} a_{mk} \sum_{i=0}^{k} c_{ki}|x_L(n-l-m)|^{2(k-i)}|x_U(n-l-m)|^{2i}\right] +$$

$$\left[\sum_{l=0}^{N_{lb_{xb}}-1} x_U(n-l)\right.$$

$$\left.\sum_{m=-N_{mc_{xb}}}^{N_{mb_{xb}}} b_{lm} \sum_{k=1}^{N_{kb_{xb}}} a_{mk} \sum_{i=0}^{k} c_{ki}|x_L(n-l-m)|^{2(k-1-i)}|x_U(n-l-m)|^{2i} x_L(n-l-m)x_U^*(n-l-m)\right] +$$

$$\left[\sum_{l=0}^{N_{la_{xbim}}-1} x_U^*(n-l) \sum_{k=0}^{N_{ka_{xbim}}-1} b_{lk} \sum_{i=0}^{k} c_{ki}|x_U(n-l)|^{2i}|x_L(n-l)|^{2(k-i)}\right],$$

where:
$N_{lb_{xb}}$ is a cross-band memory depth;
$N_{mb_{xb}}$ is a cross-band backward cross term length;
$N_{mc_{xb}}$ is a cross-band backward cross term length;
$N_{kb_{xb}}$ is a cross-band nonlinearity order;
$N_{la_{xbim}}$ is a cross-band image memory depth;
$N_{ka_{xbim}}$ is a cross-band image nonlinearity order;
$a_{mk}$, $b_{lk}$, $k_{lm}$, and $c_{ki}$ are the signal generation coefficients; and
$x_{U*}$ is a conjugative signal of $x_U$.

8. The transmitter system of claim 7, wherein the distortion compensation processing module is configured to generate the pre-distorted high-frequency signal based on a following equation:

$$y_U(n) =$$

$$\left[\sum_{l=0}^{N_{lb_{xb}}-1} x_U(n-l) \sum_{m=-N_{mc_{xb}}}^{N_{mb_{xb}}} b_{lm} \sum_{k=1}^{N_{kb_{xb}}} a_{mk} \sum_{i=0}^{k} c_{ki}|x_U(n-l-m)|^{2(k-i)}|x_L(n-l-m)|^{2i}\right] +$$

$$\left[\sum_{l=0}^{N_{lb_{xb}}-1} x_L(n-l) \sum_{m=-N_{mc_{xb}}}^{N_{mb_{xb}}} b_{lm}\right.$$

-continued $$\sum_{k=1}^{N_{kb_{xb}}} a_{mk} \sum_{i=0}^{k} c_{ki} |x_U(n-l-m)|^{2(k-1-i)} |x_L(n-l-m)|^{2i} x_U(n-l-m) x_L^*(n-l-m) \Bigg] +$$

$$\left[ \sum_{l=0}^{N_{la_{xbim}}-1} x_L^*(n-l) \sum_{k=0}^{N_{ka_{xbim}}-1} b_{lk} \sum_{i=0}^{k} a_{mk} |x_L(n-l)|^{2i} |x_U(n-l)|^{2(k-i)} \right],$$

where $x^*_L$ is a conjugative signal of $x_L$.

9. A method comprising:

extracting, by a signal decomposition module, a low-frequency signal ($S_{lo}$) and a high-frequency signal ($S_{hi}$) from an input signal ($S_{in}$);

generating, by a first in-phase/quadrature (IQ) demodulator, a detected low-frequency feedback signal ($Y_{lo}$) based on an output signal ($S_{out}$) using a first frequency (Fl) determined by a first oscillator;

generating, by a second IQ demodulator, a detected high-frequency feedback signal ($Y_{hi}$) based on the output signal ($S_{out}$) using a second frequency (Fh) determined by a second oscillator;

updating, by a signal characteristic estimation processing module, signal generation coefficients based on comparing the low-frequency signal ($S_{lo}$) and the high-frequency signal ($S_{hi}$) with the detected low-frequency feedback signal ($Y_{lo}$) and the detected high-frequency feedback signal ($Y_{hi}$);

generating, by a distortion compensation processing module, a pre-distorted low-frequency signal ($U_{lo}$) and a pre-distorted high-frequency signal ($U_{hi}$) based on the low-frequency and high-frequency signals using the updated signal generation coefficients;

combining, by a signal combining module, the pre-distorted low-frequency signal ($U_{lo}$) and the pre-distorted high-frequency signal ($U_{hi}$) to generate a combined signal ($U_{out}$); and generating the output signal ($S_{out}$) by modulating the combined signal ($U_{out}$) at a carrier center frequency value (Fc) that is an arithmetic mean of the first frequency (Fl) and the second frequency (Fh).

10. The method of claim 9, wherein the output signal ($S_{out}$) is obtained via a feedback loop.

11. The method of claim 9, wherein a difference between the first frequency (Fl) and the second frequency (Fh) is at least 50 MHz.

12. The method of claim 9, wherein a difference between the first frequency (Fl) and the second frequency (Fh) is at least 100 MHz.

13. The method of claim 9, wherein a difference between the first frequency (Fl) and the second frequency (Fh) is at least 150 MHz.

14. The method of claim 9, wherein a difference between the first frequency (Fl) and the second frequency (Fh) is at least 300 MHz.

15. A non-transitory computer-readable medium storing instructions therein which, when run on a processor, causes the processor to:

extract a low-frequency signal ($S_{lo}$) and a high-frequency signal ($S_{hi}$) from an input signal ($S_{in}$);

generate a detected low-frequency feedback signal ($Y_{lo}$) by demodulating an output signal ($S_{out}$) at a first frequency (Fl);

generate a detected high-frequency feedback signal ($Y_{hi}$) by demodulating the output signal ($S_{out}$) at a second frequency (Fh) different from the first frequency value;

update signal generation coefficients based on comparing the low-frequency signal ($S_{lo}$) and the high-frequency signal ($S_{hi}$) with the detected low-frequency feedback signal ($Y_{lo}$) and the detected high-frequency feedback signal ($Y_{hi}$);

generate a pre-distorted low-frequency signal ($U_{lo}$) and a pre-distorted high-frequency signal ($U_{hi}$) based on the low-frequency and high-frequency signals using the updated signal generation coefficients;

generate a combined signal ($U_{out}$) by combining the pre-distorted low-frequency signal ($U_{lo}$) and the pre-distorted high-frequency signal ($U_{hi}$); and generate the output signal ($S_{out}$) by modulating the combined signal ($U_{out}$) at a carrier center frequency value (Fc) that is an arithmetic mean of the first frequency (Fl) and the second frequency (Fh).

16. The non-transitory computer-readable medium of claim 15, wherein the output signal ($S_{out}$) is obtained via a feedback loop.

17. The non-transitory computer-readable medium of claim 15, wherein a difference between the first frequency (Fl) and the second frequency (Fh) is at least 50 MHz.

18. The non-transitory computer-readable medium of claim 15, wherein a difference between the first frequency (Fl) and the second frequency (Fh) is at least 100 MHz.

19. The non-transitory computer-readable medium of claim 15, wherein a difference between the first frequency (Fl) and the second frequency (Fh) is at least 150 MHz.

20. The non-transitory computer-readable medium of claim 15, wherein a difference between the first frequency (Fl) and the second frequency (Fh) is at least 300 MHz.

\* \* \* \* \*